United States Patent
Noguchi et al.

(10) Patent No.: US 7,068,196 B2
(45) Date of Patent: Jun. 27, 2006

(54) DIGITAL SIGNAL PROCESSING DEVICE AND DIGITAL SIGNAL PROCESSING METHOD

(75) Inventors: Masayoshi Noguchi, Chiba (JP); Gen Ichimura, Tokyo (JP); Nobukazu Suzuki, Kanagawa (JP)

(73) Assignee: Sony Corporation, Tokyo (JP)

( * ) Notice: Subject to any disclaimer, the term of this patent is extended or adjusted under 35 U.S.C. 154(b) by 132 days.

(21) Appl. No.: 10/489,947

(22) PCT Filed: Jul. 29, 2003

(86) PCT No.: PCT/JP03/09614

§ 371 (c)(1),
(2), (4) Date: Mar. 17, 2004

(87) PCT Pub. No.: WO2004/015872

PCT Pub. Date: Feb. 19, 2004

(65) Prior Publication Data

US 2004/0239538 A1   Dec. 2, 2004

(30) Foreign Application Priority Data

Aug. 9, 2002 (JP) .................................... 2002-233575

(51) Int. Cl.
*H03M 3/00* (2006.01)

(52) U.S. Cl. .................... 341/143; 341/77; 341/155; 375/247

(58) Field of Classification Search ................ 341/143, 341/155, 144, 145, 156, 118, 120, 161, 77; 375/247

See application file for complete search history.

(56) References Cited

U.S. PATENT DOCUMENTS

| 5,793,316 | A | * | 8/1998 | Noguchi et al. ............... 341/77 |
| 5,859,603 | A | * | 1/1999 | Noguchi et al. ............... 341/77 |
| 6,064,700 | A | * | 5/2000 | Noguchi et al. ............ 375/247 |
| 6,600,789 | B1 | * | 7/2003 | Lipasti et al. ................ 375/247 |

FOREIGN PATENT DOCUMENTS

| EP | 0735461 | 10/1996 |
| EP | 0783207 | 7/1997 |

* cited by examiner

*Primary Examiner*—John B Nguyen
(74) *Attorney, Agent, or Firm*—Jay H. Maioli

(57) ABSTRACT

An apparatus for processing a digital signal that generates a one-bit output signal using a delta-sigma modulation apparatus, which includes a quantizer for quantizing an integrated output of a sixth integrator to generate a one-bit output signal that is send to respective integrators through an adder under feedback processing to output the one-bit output signal to the outside of a six-order Delta-sigma modulator, and a control unit for generating a control signal that controls the feedback loop signal from the quantizer so as to change the signal level of a signal component of the audio frequency band of the one-bit output signal. The control unit receives an integrated output from a second integrator being an input side integrator of the six-order delta-sigma modulator.

16 Claims, 10 Drawing Sheets

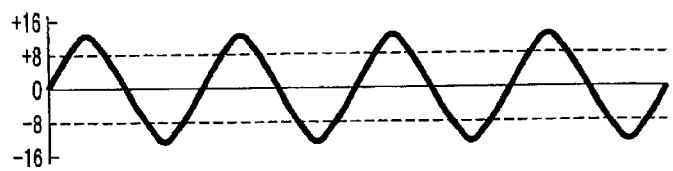
Fig.4A OUTPUT OF SECOND INTEGRATOR
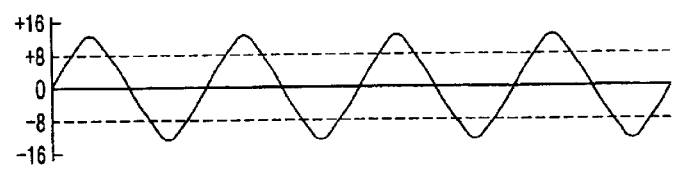
Fig.4B OUTPUT OF MOVING AVERAGE FILTER
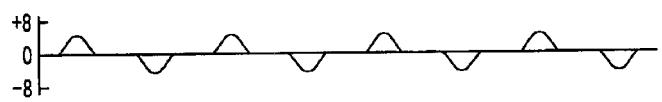
Fig.4C OVER LEVEL DETECTED BY OVER LEVEL DETECTOR
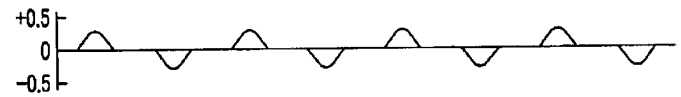
Fig.4D LEVEL-CHANGED SIGNAL
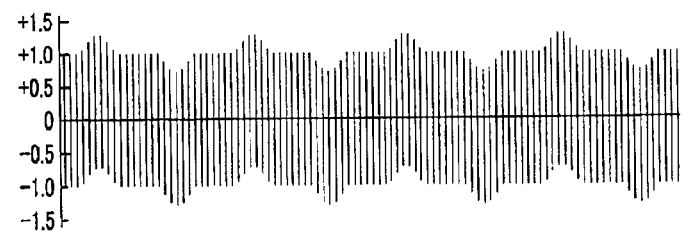
Fig.4E FEEDBACK LOOP SIGNAL
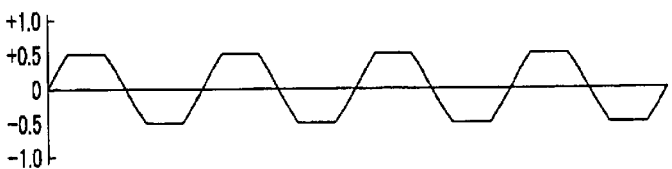
Fig.4F SIGNAL COMPONENT OF AUDIO FREQUENCY BAND OF ONE-BIT OUTPUT SIGNAL

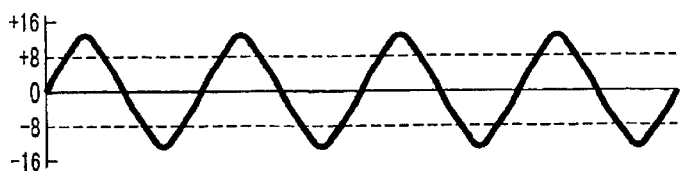
Fig.8A OUTPUT OF SECOND INTEGRATOR
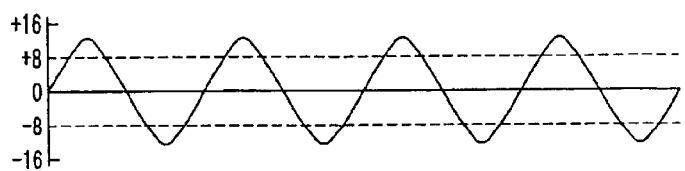
Fig.8B OUTPUT OF MOVING AVERAGE FILTER
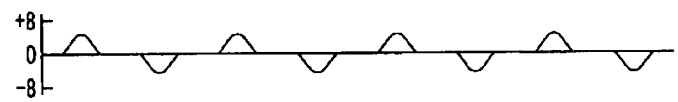
Fig.8C OVER LEVEL DETECTED BY OVER LEVEL DETECTOR
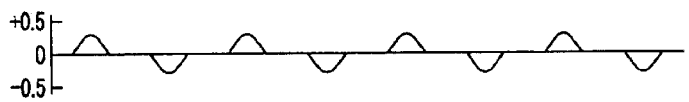
Fig.8D LEVEL-CHANGED SIGNAL
Fig.8E LIMITER PROPERTY CHANGE SIGNAL
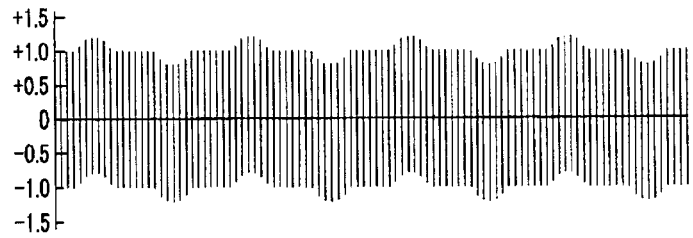
Fig.8F FEEDBACK LOOP SIGNAL
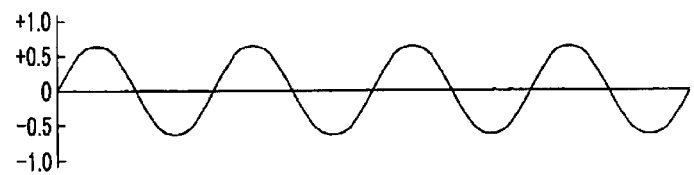
Fig.8G SIGNAL COMPONENT OF AUDIO FREQUENCY BAND OF ONE-BIT OUTPUT SIGNAL

DIGITAL SIGNAL PROCESSING DEVICE AND DIGITAL SIGNAL PROCESSING METHOD

This is a 371 of PCT/JP03/09614, filed Jul. 29, 2003.

TECHNICAL FIELD

The present invention relates to an apparatus and method for processing a digital signal, in particular, to an apparatus and method for processing a digital signal to generate a one-bit output signal using a ΔΣ modulation apparatus.

This application claims priority of Japanese Patent Application No. 2002-233575, filed on Aug. 9, 2002, the entirety of which is incorporated by reference herein.

BACKGROUND ART

The data format of a ΔΣ-modulated high speed one-bit audio signal is of significantly high sampling frequency and of short data length, such as sampling frequency of 64 times 44.1 kHz and data length of one bit, as compared with that of a conventional digital audio signal, such as sampling frequency of 44.1 kHz and data length of 16 bits, and is characterized by broad transmittable frequency band. Although the ΔΣ-modulated signal is a one-bit signal, high dynamic range can be secured in audio frequency band which is low as compared with the over sampling frequency of 64 times. Taking advantage of the property, the ΔΣ-modulated signal is applicable to data recording and data transmission, keeping high sound quality.

A ΔΣ modulation circuit is not a particularly new technology, and is conventionally often used is an AD converter, etc. since it can be configured in the form of an IC properly and AD conversion with high accuracy can be realized with ease relatively.

A ΔΣ-modulated signal can be restored to an analog audio signal by causing the ΔΣ-modulated signal to pass through a simple analog low-pass filter.

In a ΔΣ-modulated signal, there exists the maximum amplitude level of representable audio frequency band. Thus, a large-level signal whose amplitude level surpasses the maximum amplitude level cannot be represented. Furthermore, when an overflowed signal, which is generated by adding two kinds of one-bit signals, is sent to a ΔΣ modulator of high order so as to obtain a one-bit signal, a signal processing circuit becomes unstable.

For example, when mixing one-bit signals, the amplitude level of a resultant output signal may surpass that of original signals, or surpass an amplitude level that can be represented by a one-bit signal. When converting such a large-level signal to a one-bit signal using a digital signal processing apparatus provided with a ΔΣ modulator of high order, it is necessary to perform limit processing for the amplitude level of audio frequency band using a limiter so as to prevent instability of a signal processing circuit.

FIG. 10 shows an example of a block diagram of a conventional digital signal processing apparatus 100. When adding two kinds of high speed one-bit signals A and B, generated through noise shaping, using an adder 101, the amplitude level of a resultant added output undesirably surpasses the maximum amplitude level of representable audio frequency band. So, the digital signal processing apparatus 100 performs limit processing for an audio frequency band signal being the added output.

Firstly, an FIR filter 102 detects audio frequency band. Secondly, an over level detector 103 detects an over level surpassing from a reference level. Then, the over level detector 103 sets thus detected over level to be of negative, and an adder 105 adds thus generated negative over level to the added output sent from the adder 101 which is delayed by a delay line 104. Thus, the over level of the audio frequency band is subtracted from the audio frequency band signal by the adder 105, suppressing the over level. Then, the audio frequency band signal which has its over level suppressed is sent to a ΔΣ modulator 106 to be a one-bit output signal.

The FIR filter 102, which has to remove quantization noise component concentrated at high range raised after undergoing noise shaping so as to detect signal component of audio frequency band, is a filter having steep attenuation property. The FIR filter 102 of steep attenuation property is undesirably enlarged in size since multipliers, etc. are used. Furthermore, in view of delay time brought about by the large-sized FIR filter 102, the delay line 104 has to set long delay time.

DISCLOSURE OF THE INVENTION

Accordingly, the present invention has an object to overcome the above-mentioned drawbacks of the prior art by providing a new apparatus and method for processing a digital signal.

The present invention has another object to provide an apparatus and method for processing a digital signal which enable limit processing under small-sized hardware configuration in performing ΔΣ modulation.

The above object can be attained by providing an apparatus for processing a digital signal having plural "m" sets of integrators connected in series that performs "m"-order ΔΣ modulation for a one-bit input signal processed under predetermined signal processing, including:

quantization means for quantizing an output sent from the last integrator of the "m" sets of integrators connected in series to generate a one-bit signal;

control means for generating a control signal that controls the amplitude level of signal component of audio frequency band of a one-bit signal sent from the quantization means, the one-bit signal being to be sent to the plural integrators under feedback processing; and amplitude change means for changing the amplitude level of signal component of audio frequency band of a one-bit signal sent from the quantization means based on the control signal sent from the control means.

The control means generates the control signal based on an output sent from one integrator of the plural integrators connected in series. The control means has filter means for extracting signal component of audio frequency band out of an output sent from one integrator of the plural integrators connected in series.

The control means compares an output sent from one integrator of the plural integrators connected in series with a predetermined reference signal, and generates the control signal based on the comparison result. The control means further has level change means for multiplying the comparison result between an output sent from one integrator of the plural integrators connected in series and a predetermined reference signal by predetermined times. The control means may further have limiter property change means for giving nonlinear property to the comparison result between an output sent from one integrator of the plural integrators connected in series and a predetermined reference signal.

The control means, which generates the control signal based on an output sent from one integrator of the plural integrators connected in series, has envelope peak detection means for detecting a peak of envelope from an output sent from one integrator of the plural integrators connected in series over long time constant, and over level ratio detection means for calculating a ratio of a peak value detected by the envelope peak detection means to a reference level, when the peak value surpasses the reference level, and generates the control signal based on thus calculated ratio.

The amplitude change means of the apparatus for processing a digital signal according to the present invention adds the control signal sent from the control means to a one-bit signal sent from the quantization means to change the amplitude of a one-bit signal sent from the quantization means.

The amplitude change means may multiply a one-bit signal sent from the quantization means by the control signal sent from the control means to change the amplitude of a one-bit signal sent from the quantization means.

Also, the above object can be attained by providing a method for processing a digital signal using plural "m" sets of integrators connected in series that performs "m"-order $\Delta\Sigma$ modulation for a one-bit input signal processed under predetermined signal processing, including:

quantization step of quantizing an output sent from the last integrator of the "m" sets of integrators connected in series to generate a one-bit signal;

control step of generating a control signal that controls the amplitude level of signal component of audio frequency band of a one-bit signal that is generated by quantizing an output of the last integrator, the one-bit signal being to be sent to the plural integrators under feedback processing; and amplitude change step of changing the amplitude level of signal component of audio frequency band of a one-bit signal that is generated by quantizing an output of the last integrator based on the control signal.

These objects and other objects, features and advantages of the present invention will become more apparent from the following detailed description of the preferred embodiments of the present invention.

BRIEF DESCRIPTION OF THE DRAWINGS

FIG. 4A to FIG. 4F show timing charts for explaining the operation of the first embodiment of the digital signal processing apparatus according to the present invention.

FIG. 8A to FIG. 8G show timing charts for explaining the operation of the second embodiment of the digital signal processing apparatus according to the present invention.

BEST MODE FOR CARRYING OUT THE INVENTION

The apparatus and method for processing a digital signal of the present invention will further be described below concerning the best modes for carrying out the present invention with reference to the accompanying drawings.

Figure 1:
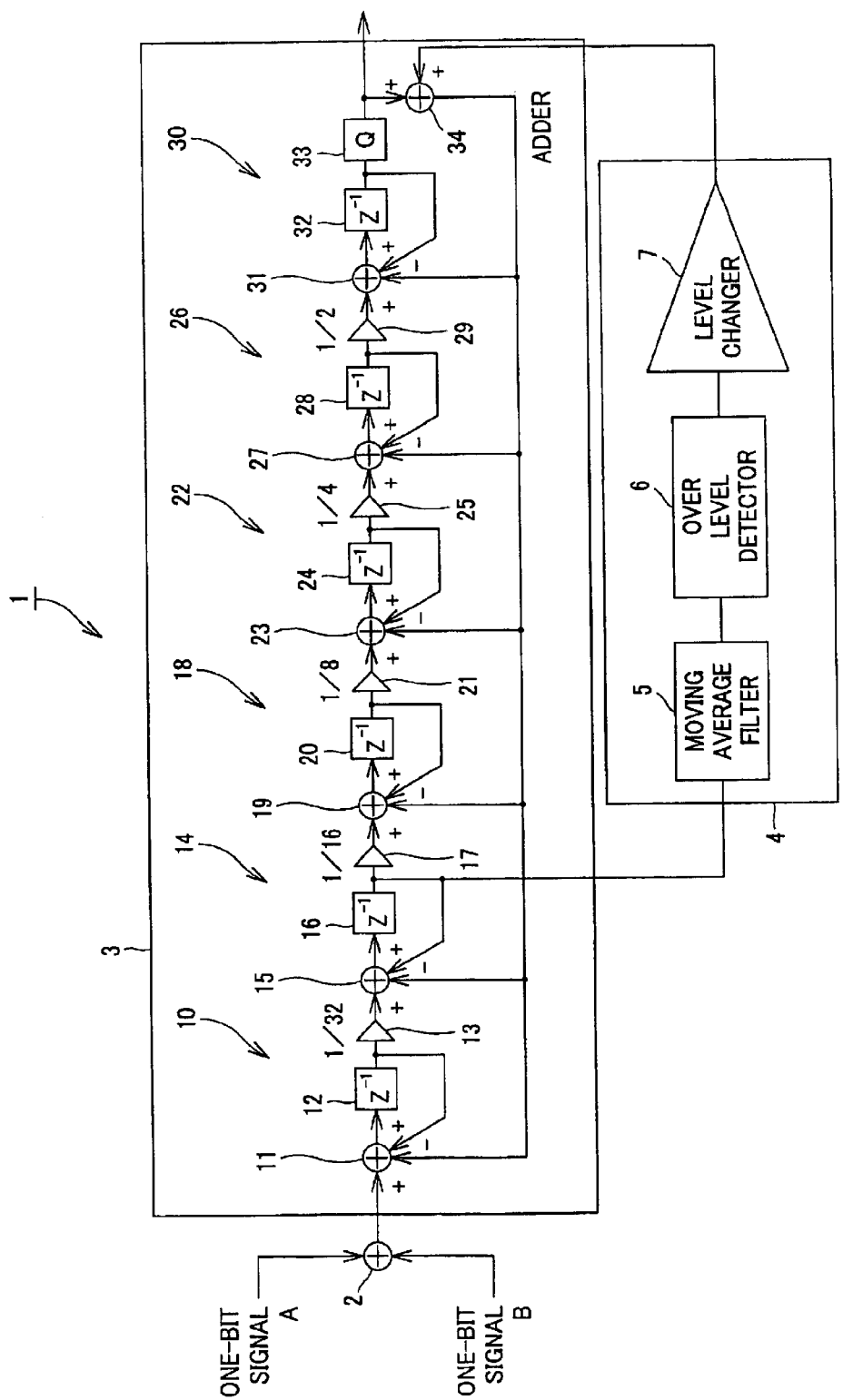
FIG. 1 shows a block diagram of the first embodiment of an apparatus for processing a digital signal according to the present invention.
Figure 2:
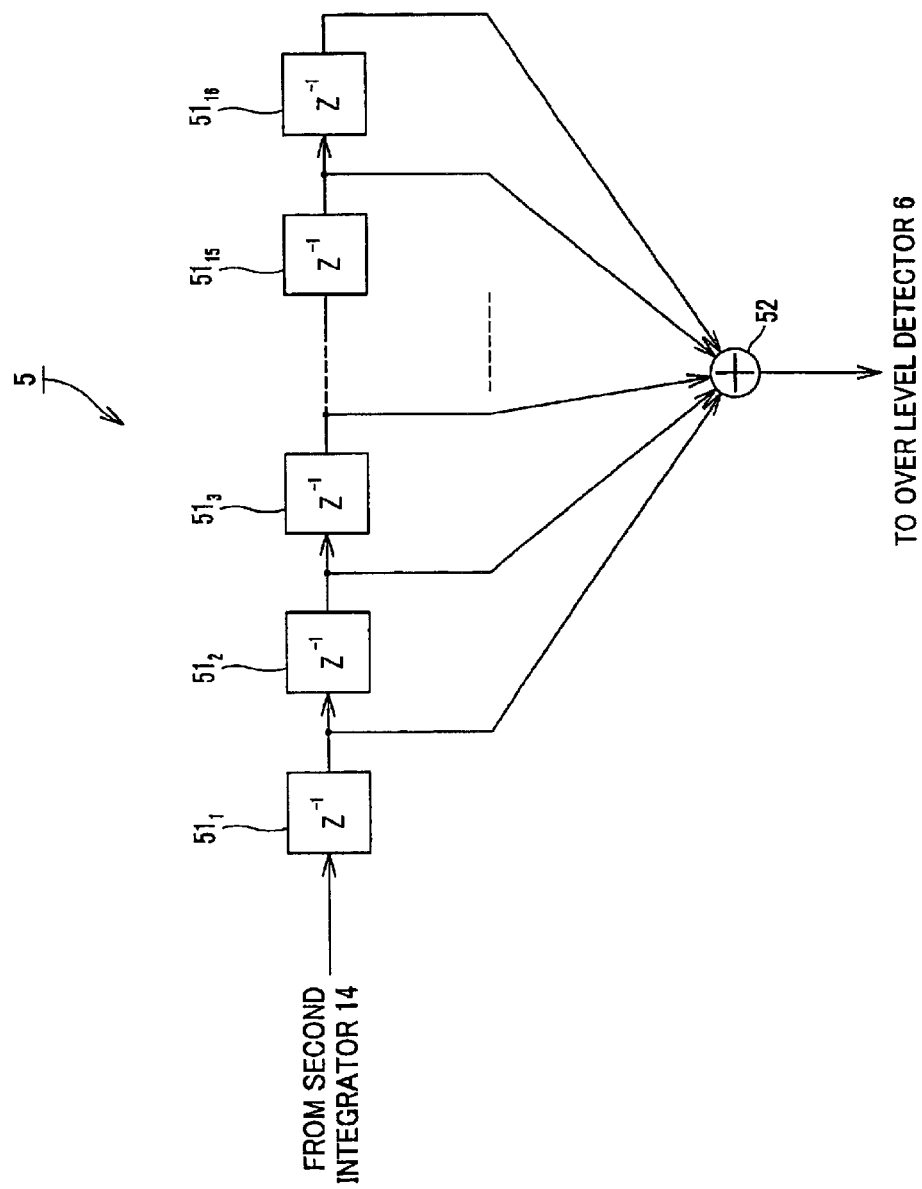
FIG. 2 shows a circuit diagram of a moving average filter.

Referring to FIG. 1 to FIG. 4, the first embodiment of the present invention will be explained. FIG. 1 shows a block diagram of a digital signal processing apparatus 1 of the first embodiment which adds a one-bit signal A and a one-bit signal B, generated through $\Delta\Sigma$ modulation processing, using an adder 2, and sends a resulting added output to a $\Delta\Sigma$ modulator 3 of six order so as to output a one-bit signal.

The added output from the adder 2 sometimes surpasses the maximum amplitude level of audio frequency band which can be represented by a $\Delta\Sigma$-modulated one-bit signal due to overflow. Thus, a large-level signal surpassing the maximum amplitude level of audio frequency band cannot be represented by a one-bit signal.

When $\Delta\Sigma$ modulating the added output, the digital signal processing apparatus 1 sets a large-level signal surpassing the maximum amplitude level of audio frequency band to be of level which can be represented by a one-bit signal. In this processing, the digital signal processing apparatus 1 performs limit processing for the amplitude level of audio frequency band of the added output so that its signal processing circuit does not become unstable, and outputs a one-bit signal.

So, the digital signal processing apparatus 1 includes a quantizer 33 for quantizing an output of an integrator 30, which is the last integrator among six integrators of the six-order $\Delta\Sigma$ modulator 3, to generate a one-bit output signal, and a control unit 4 for generating a control signal which controls a feedback loop signal to be sent to respective integrators among the one-bit output signal so as to change the level of signal component of audio frequency band of the one-it output signal generated by the quantizer 33.

The six-order $\Delta\Sigma$ modulator 3 includes a first integrator 10, a second integrator 14, a third integrator 18, a fourth integrator 22, a fifth integrator 26, and the sixth integrator 30. Moreover, the six-order $\Delta\Sigma$ modulator 3 includes a first coefficient multiplier 13 for multiplying an integrated output from the first integrator 10 by a first coefficient to attenuate the integrated output, a second coefficient multiplier 17 for multiplying an integrated output from the second integrator 14 by a second coefficient to attenuate the integrated output, a third coefficient multiplier 21 for multiplying an integrated output from the third integrator 18 by a third coefficient to attenuate the integrated output, a fourth coefficient multiplier 25 for multiplying an integrated output from the fourth integrator 22 by a fourth coefficient to attenuate the integrated output, and a fifth coefficient multiplier 29 for multiplying an integrated output from the fifth integrator 26 by a fifth coefficient to attenuate the integrated output. Furthermore, the six-order $\Delta\Sigma$ modulator 3 includes the quantizer 33 for quantizing an integrated output from the sixth integrator 30 being the last integrator, and an adder 34 for adding the control signal generated by the control unit 4 to the feedback loop signal from the quantizer 33 to be sent to the respective integrators.

The first integrator 10 consists of an adder 11 and a shift arithmetical element 12. The second integrator 14 consists of an adder 15 and a shift arithmetical element 16. The third integrator 18 consists of an adder 19 and a shift arithmetical element 20. The fourth integrator 22 consists of an adder 23 and a shift arithmetical element 24. The fifth integrator 26 consists of an adder 27 and a shift arithmetical element 28. The sixth integrator 30 consists of an adder 31 and a shift arithmetical element 32.

When an added output from the adder 2 is sent to the $\Delta\Sigma$ modulator 3, the first integrator 10 sends the added output to the shift arithmetical element 12 through the adder 11. The shift arithmetical element 12 shifts an added output sent from the adder 11, and returns thus shifted added output to the adder 11. The adder 11 has the feedback loop signal, to which the control signal is added by the adder 34, sent thereto under negative feedback. An integrated output of the first integrator 10 is sent to the first coefficient multiplier 13. The first coefficient multiplier 13 multiplies the integrated output from the first integrator 10 by a first coefficient "1/32" to attenuate the integrated output, and sends thus attenuated integrated output to the second integrator 14.

The second integrator 14 sends a multiplied output from the first coefficient multiplier 13 to the shift arithmetical element 16 through the adder 15. The shift arithmetical element 16 shifts an added output sent from the adder 15, and returns thus shifted added output to the adder 15. The adder 15 has the feedback loop signal, to which the control signal is added by the adder 34, sent thereto under negative feedback. An integrated output of the second integrator 14 is sent to the second coefficient multiplier 17. The second coefficient multiplier 17 multiplies the integrated output from the second integrator 14 by a second coefficient "1/16" to attenuate the integrated output, and sends thus attenuated integrated output to the third integrator 18.

The third integrator 18 sends a multiplied output from the second coefficient multiplier 17 to the shift arithmetical element 20 through the adder 19. The shift arithmetical element 20 shifts an added output sent from the adder 19, and returns thus shifted added output to the adder 19. The adder 19 has the feedback loop signal, to which the control signal is added by the adder 34, sent thereto under negative feedback. An integrated output of the third integrator 18 is sent to the third coefficient multiplier 21. The third coefficient multiplier 21 multiplies the integrated output from the third integrator 18 by a third coefficient "1/8" to attenuate the integrated output, and sends thus attenuated integrated output to the fourth integrator 22.

The fourth integrator 22 sends a multiplied output from the third coefficient multiplier 21 to the shift arithmetical element 24 through the adder 23. The shift arithmetical element 24 shifts an added output sent from the adder 23, and returns thus shifted added output to the adder 23. The adder 23 has the feedback loop signal, to which the control signal is added by the adder 34, sent thereto under negative feedback. An integrated output of the fourth integrator 22 is sent to the fourth coefficient multiplier 25. The fourth coefficient multiplier 25 multiplies the integrated output from the fourth integrator 22 by a fourth coefficient "1/4" to attenuate the integrated output, and sends thus attenuated integrated output to the fifth integrator 26.

The fifth integrator 26 sends a multiplied output from the fourth coefficient multiplier 25 to the shift arithmetical element 28 through the adder 27. The shift arithmetical element 28 shifts an added output sent from the adder 27, and returns thus shifted added output to the adder 27. The adder 27 has the feedback loop signal, to which the control signal is added by the adder 34, sent thereto under negative feedback. An integrated output of the fifth integrator 26 is sent to the fifth coefficient multiplier 29. The fifth coefficient multiplier 29 multiplies the integrated output from the fifth integrator 26 by a fifth coefficient "1/2" to attenuate the integrated output, and sends thus attenuated integrated output to the sixth integrator 30.

The sixth integrator 30 sends a multiplied output from the fifth coefficient multiplier 29 to the shift arithmetical element 32 through the adder 31. The shift arithmetical element 32 shifts an added output sent from the adder 31, and returns thus shifted added output to the adder 31. The adder 31 has the feedback loop signal, to which the control signal is added by the adder 34, sent thereto under negative feedback. An integrated output of the sixth integrator 30 is sent to the quantizer 33.

The quantizer 33 quantizes the integrated output from the sixth integrator 30 to output a one-bit signal. The one-bit signal is sent to the respective integrators as the feedback loop signal under negative feedback through the adder 34. The quantizer 33 outputs the one-bit output signal to the outside of the six-order $\Delta\Sigma$ modulator 3.

The control unit 4 generates a control signal that controls the feedback loop signal sent from the quantizer 33 so as to change the level of signal component of audio frequency band of the one-bit output signal. So, the control unit 4 receives an integrated output from the second integrator 14 being an input side integrator of the six-order $\Delta\Sigma$ modulator 3.

The control unit 4 includes a moving average filter 5 for detecting signal component of audio frequency band of the integrated output sent from the second integrator 14, an over level detector 6 for detecting an over level of the audio frequency band signal detected by the moving average filter 5, and a level changer 7 for changing the signal level of an over level detected by the over level detector 6.

The moving average filter 5 has shift arithmetical elements $51_1$ to $51_{16}$ connected in series, and detects signal component of audio frequency band out of the integrated output sent from the second integrator 14 by adding shifted outputs from the respective shift arithmetical elements $51_1$ to $51_{16}$ using an adder 52.

The output of the second integrator 14 has its high range component attenuated due to the property of the $\Delta\Sigma$ modulator, and dominatingly has signal component of audio frequency band, while having certain high range quantized noise component raised by noise shaping. In order to attenuate the noise component, signal component of audio frequency band is detected using the 16-tap moving average filter 5. A filter used in the control unit 4 may be a moving average filter with the number of taps set to be approximately that shown in FIG. 2, and no multiplier is required to be provided. That is, a filter which can be realized with a small-sized hardware.

In the digital signal processing apparatus 1, it is necessary to equalize delay time brought about by the filter of the control unit 4 with that brought about by the second integrator 14 to the quantizer 33 of the $\Delta\Sigma$ modulator 3. In this configuration, since delay time in the latter case becomes of 16 samples, delay time in the control unit 4 can be equalized with that brought about by the second integrator 14 to the quantizer 33 by using the moving average filter 5 of 16 taps.

Figure 3:
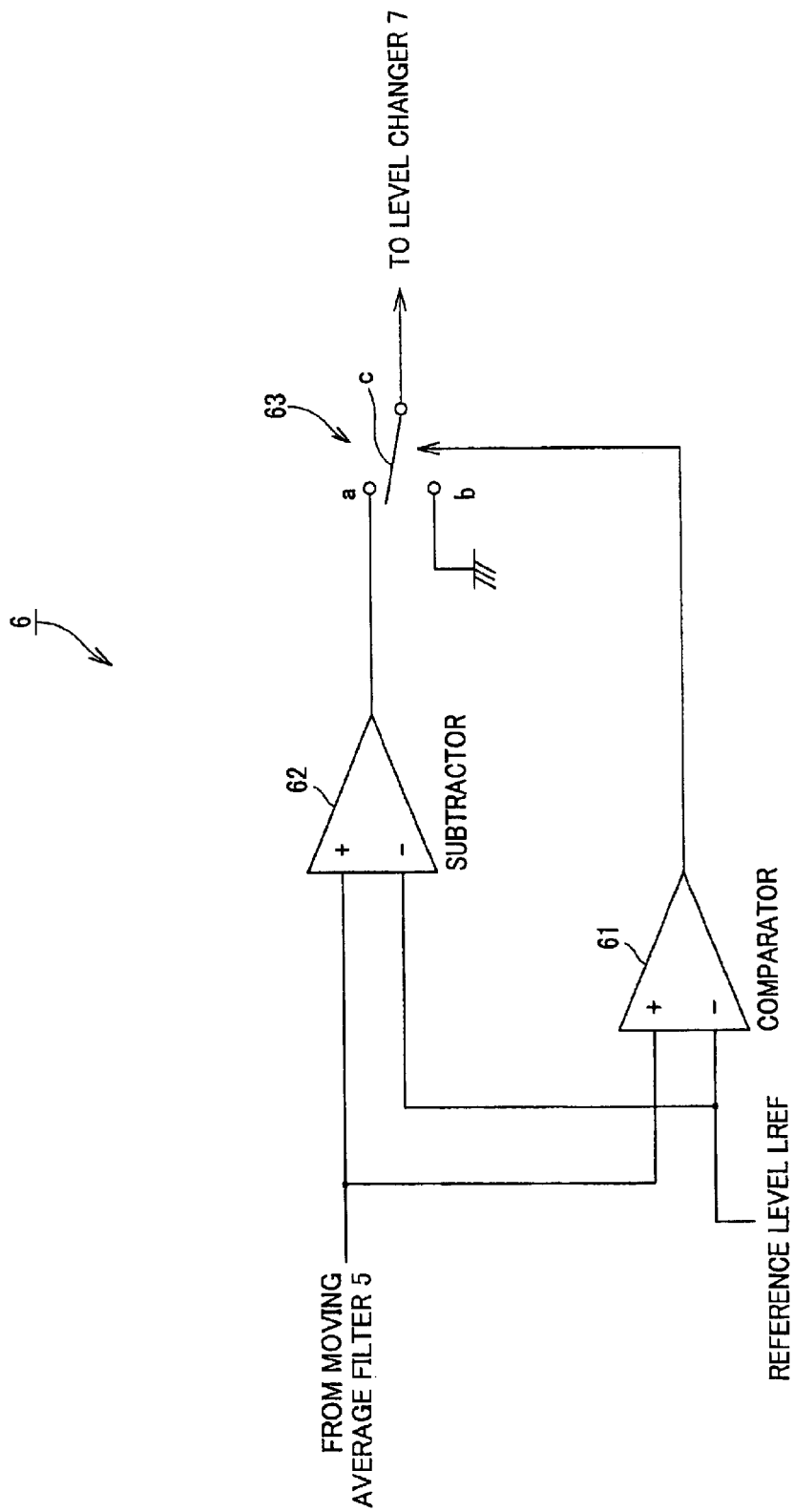
FIG. 3 shows a circuit diagram of an over level detector.

The over level detector 6 compares signal component of audio frequency band detected by the moving average filter 5 with a predetermined reference level Lref to detect an over level. As shown in FIG. 3, signal component of audio frequency band detected by the moving average filter 5 is compared with the reference level Lref by a comparator 61, and the difference therebetween is obtained by a subtractor 62. A changeover terminal "a" of a changeover switch 63 receives an output of the subtractor 62, while a changeover terminal "b" of the changeover switch 63 is connected to the ground. A changeover segment "c" of the changeover switch 63 is connected to the level changer 7. Thus, a subtracted level generated by the subtractor 62 can be output as an over level by controlling the changeover operation of the changeover switch 63 based on the comparison result of the comparator 61. Specifically, when the comparator 61 judges that signal component of audio frequency band surpasses the reference level Lref, the subtractor 62 detects a surpassing level to make it an over level and send the over level to the level changer 7 through the changeover switch 63.

The level changer 7 attenuates an audio frequency band signal sent from the second integrator 14 to one sixteenth so as to change the level of the audio frequency band signal from the second integrator 14 to a level that adapts to the level of an audio frequency band signal output from the ΔΣ modulator 3.

Thus, the control unit 4 changes the level of the over level of signal component of audio frequency band, and sends thus level-changed over level to the adder 34. The adder 34 adds the level-changed over level to a quantized output from the quantizer 33. An added output from the second integrator 14 is sent to the respective integrators under feedback processing. In this way, the control unit 4 generates a control signal to control the feedback loop signal sent from the quantizer 33 so as to change the level of signal component of audio frequency band. In result, the audio frequency band signal sent from the ΔΣ modulator 3 becomes a signal that undergoes hard limit processing.

FIG. 4A to FIG. 4F show timing charts for explaining the operation of the digital signal processing apparatus 1.

FIG. 4A shows an output of the second integrator 14. The output of the second integrator 14 has its high range component attenuated due to the property of the ΔΣ modulator, and dominatingly has signal component of audio frequency band, while having certain high range quantized noise component raised by noise shaping. In FIG. 4A, the output is shown by a bold sinusoidal wave, which indicates that the signal waveform has high range component.

FIG. 4B shows an output of the moving average filter 5. In FIG. 4B, signal component of audio frequency band which has its high range component removed is detected.

FIG. 4C shows over level component detected by the over level detector 6. In detecting the over level component, ±8 along the ordinate axis shown in FIG. 4B is set to be the reference level Lref.

FIG. 4D shows a level-changed signal whose over level component is attenuated to one sixteenth so as to change the level of the audio frequency band signal of the second integrator 14 to that of the audio frequency band signal output from the ΔΣ modulator. The level-changed signal corresponds to the control signal generated by the control unit 4.

FIG. 4E is a signal that is generated at the adder 34 by adding the level-changed signal shown in FIG. 4D to the quantized output sent from the quantizer 33, that is, the feedback loop signal that is generated by adding the control signal to the quantized output.

FIG. 4F is signal component of audio frequency band of the one-bit output signal sent from the ΔΣ modulator 3. As shown in FIG. 4F, a signal waveform after passing through an analog low-pass filter is shown. The signal is caused to be a signal that undergoes hard limit processing.

As in the above, in the digital signal processing apparatus 1, the moving average filter 5, which brings about delay time equal to that brought about by the second integrator 14 to the quantizer 33 of the ΔΣ modulator 3, detects an audio frequency band signal, and detects over level component surpassing a reference level Lref. Then, after the level of the over level component is changed, the resulting signal is added to a quantized output signal to generate a feedback loop signal, and thus generated feedback loop signal is sent to the respective integrators under feedback processing. Thus, limit processing for a ΔΣ-modulated signal can be realized using small-sized simple hardware configuration.

Figure 5:
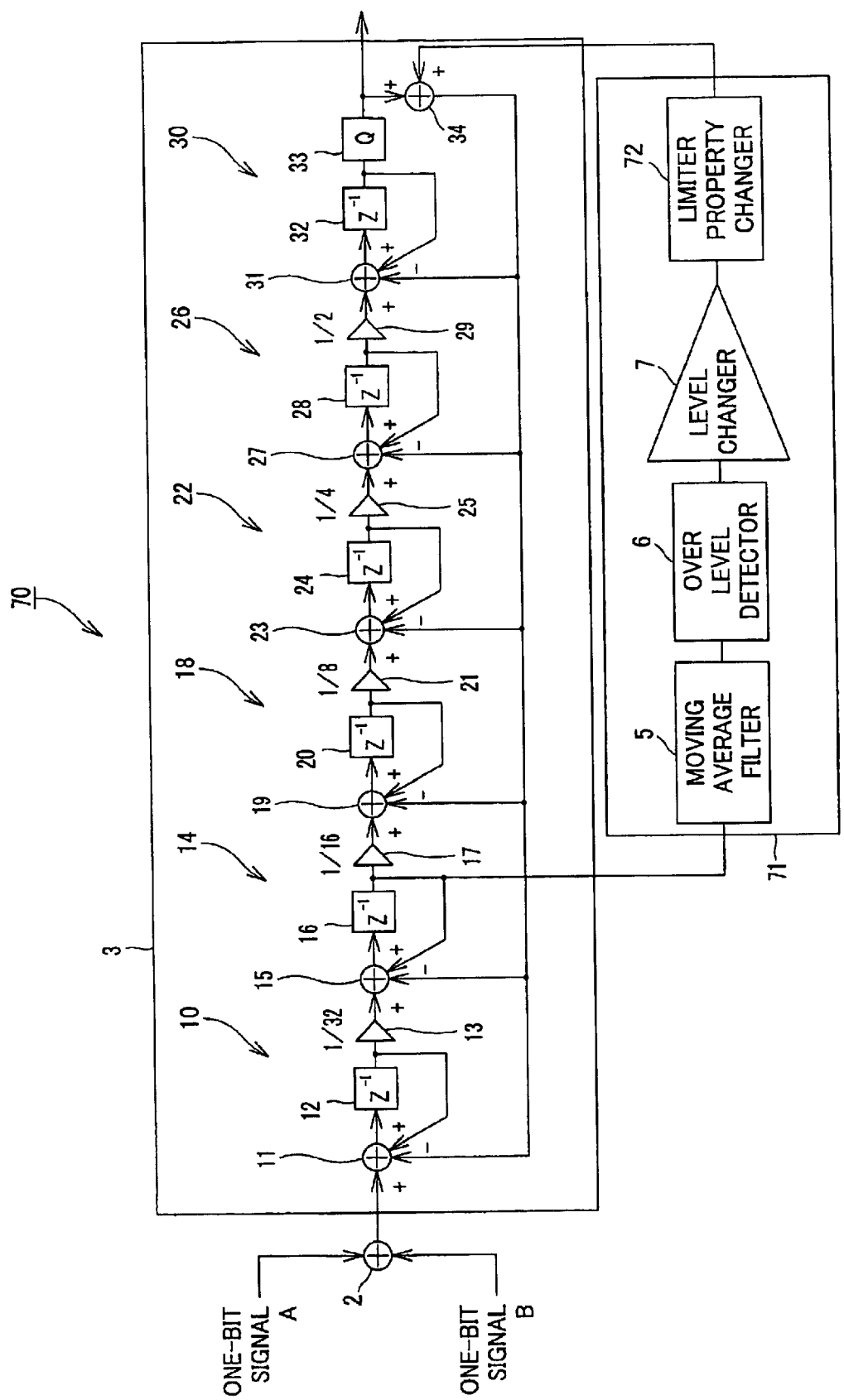
FIG. 5 shows a block diagram of the second embodiment of an apparatus for processing a digital signal according to the present invention.

Next, referring to FIG. 5 to FIG. 8, the second embodiment of the present invention will be explained. FIG. 5 shows a block diagram of a digital signal processing apparatus 70 of the second embodiment which adds a one-bit signal A and a one-bit signal B, generated through ΔΣ modulation processing, using an adder 2, and sends a resulting added output to a ΔΣ modulator 3 of six order so as to output a one-bit signal. In the digital signal processing apparatus 70 shown in FIG. 5, parts or components similar to those of the digital signal processing apparatus 1 shown in FIG. 1 are indicated with the same reference numerals, and detailed explanation of which will be omitted.

The digital signal processing apparatus 70 includes a control unit 71 whose configuration is different from that of the control unit 4 of the first embodiment. That is, the control unit 71 includes a moving average filter 5, an over level detector 6, a level changer 7, and furthermore, a limiter property changer 72 arranged at the downstream of the level changer 7.

Figure 6:
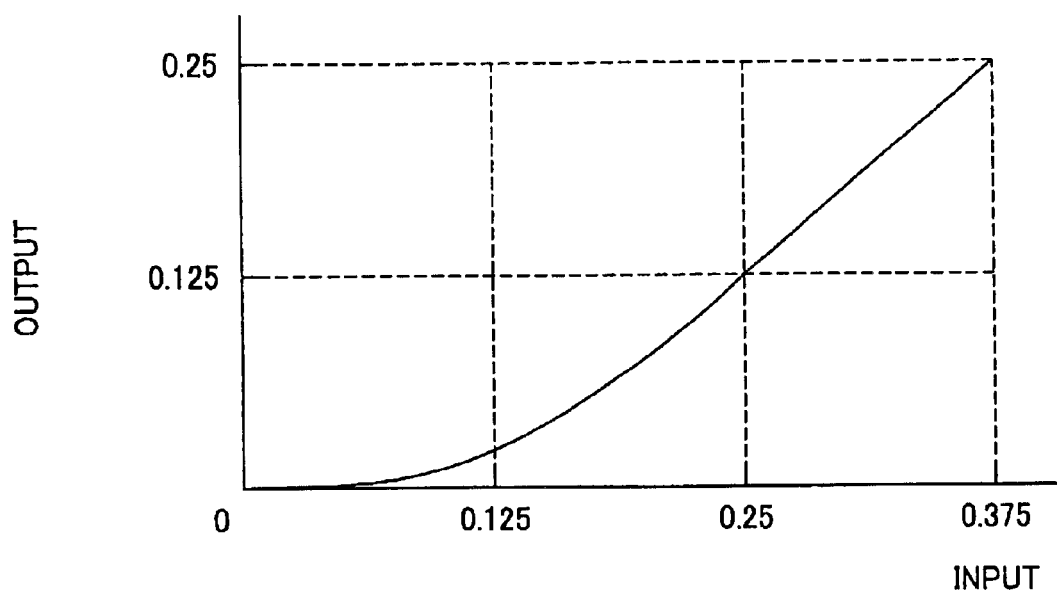
FIG. 6 shows change property of a limiter property changer.

The limiter property changer 72 performs limiter property change processing for over level component whose level is changed by the level changer 7. FIG. 6 shows an example of change property for the limiter property change processing. In FIG. 6, the abscissa axis indicates input, while the ordinate axis indicates limit output. When inputs are 0.125, 0.25, 0.375, then outputs are limited under non-linear property to be approximately 0.0208, 0.125, 0.25, respectively.

Figure 7:
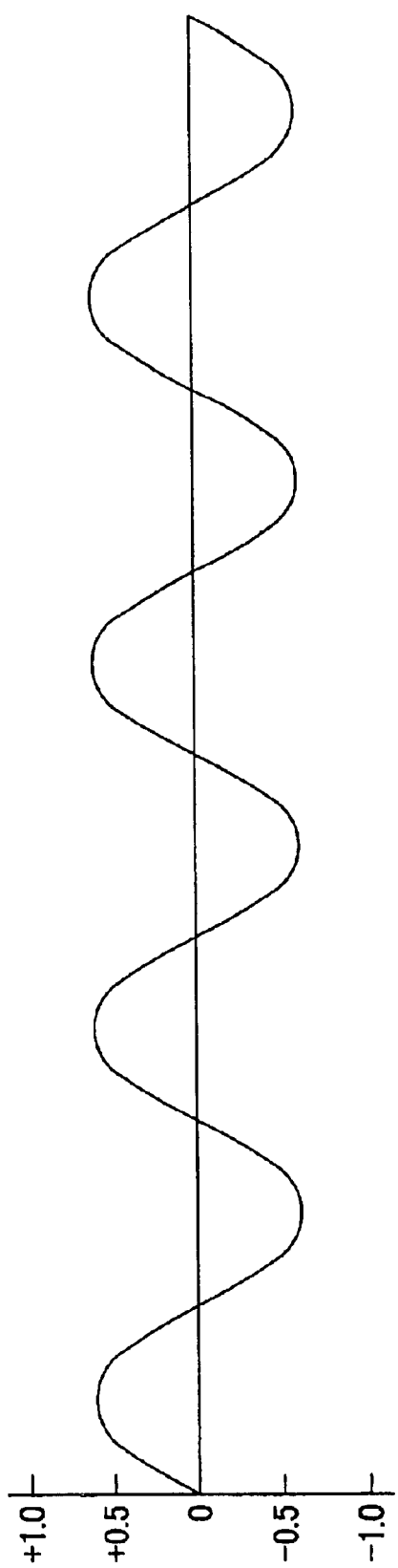
FIG. 7 shows a waveform of signal component of audio frequency band of an output signal sent from the second embodiment of the digital signal processing apparatus according to the present invention.

FIG. 7 shows a waveform of signal component of audio frequency band of a one-bit output signal generated based on a control signal that undergoes the limiter property change processing at the limiter property changer 72. The waveform is obtained by causing a one-bit output signal sent from the digital signal processing apparatus 70 to pass through an analog low-pass filter.

FIG. 8A to FIG. 8G show timing charts for explaining the operation of the digital signal processing apparatus 70. Timing charts shown in FIG. 8A to FIG. 8D are similar to those shown in FIG. 4A to FIG. 4D. FIG. 8A shows an output of the second integrator 14, FIG. 8B shows an output of the moving average filter 5, FIG. 8C shows over level component detected by the over level detector 6, and FIG. 8D shows a level-changed signal whose over level component is attenuated to one sixteenth so as to change the level of the audio frequency band signal of the second integrator 14 to that of the audio frequency band signal output from the ΔΣ modulator.

FIG. 8E shows a limiter property change signal sent from the limiter property changer 72. In FIG. 8E, parts corresponding to respective peaks of the level-changed signal shown in FIG. 8D are caused to be gradual. The limiter property change signal corresponds to a control signal generated by the control unit 71.

FIG. 8F is a feedback loop signal that is generated at the adder 34 by adding the limiter property change signal (control signal) shown in FIG. 8E to the quantized output sent from the quantizer 33.

FIG. 8G is signal component of audio frequency band of the one-bit output signal sent from the ΔΣ modulator 3. The waveform of the signal component is similar to that of the signal component shown in FIG. 7. The signal is caused to be a signal that undergoes soft limit processing.

As in the above, in the digital signal processing apparatus 70, the moving average filter 5, which brings about delay time equal to that brought about by the second integrator 14 to the quantizer 33 of the ΔΣ modulator 3, detects an audio frequency band signal, and detects over level component surpassing a reference level Lref. Then, after the level of the over level component is changed and thus level-changed signal undergoes the limiter property change processing, the resulting signal is added to a quantized output signal to generate a feedback loop signal, and thus generated feedback loop signal is sent to the respective integrators under feedback processing. Thus, soft limit property for a ΔΣ-modulated signal can be realized using small-sized simple hardware configuration.

Figure 9:
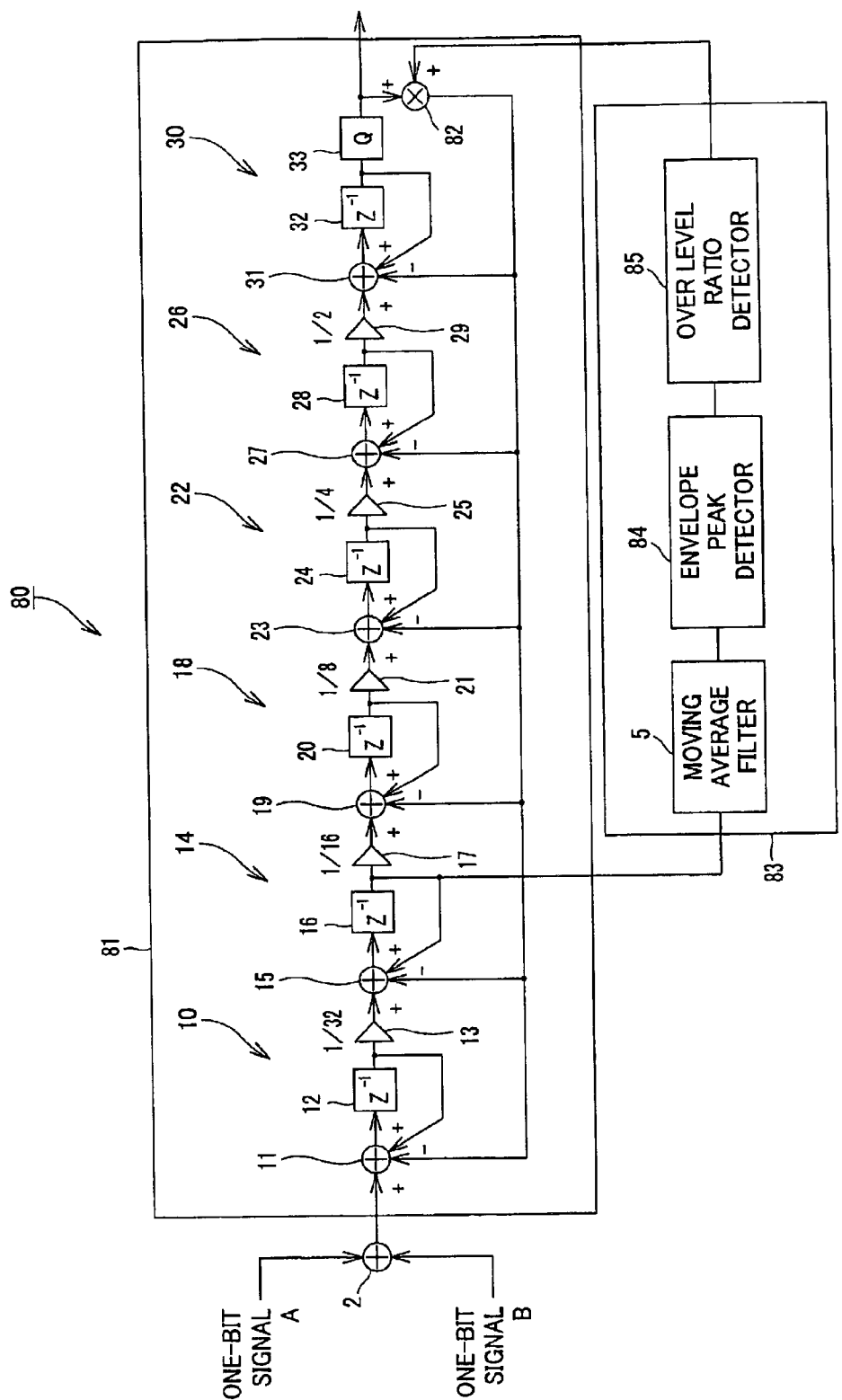
FIG. 9 shows a block diagram of the third embodiment of an apparatus for processing a digital signal according to the present invention.
Figure 10:
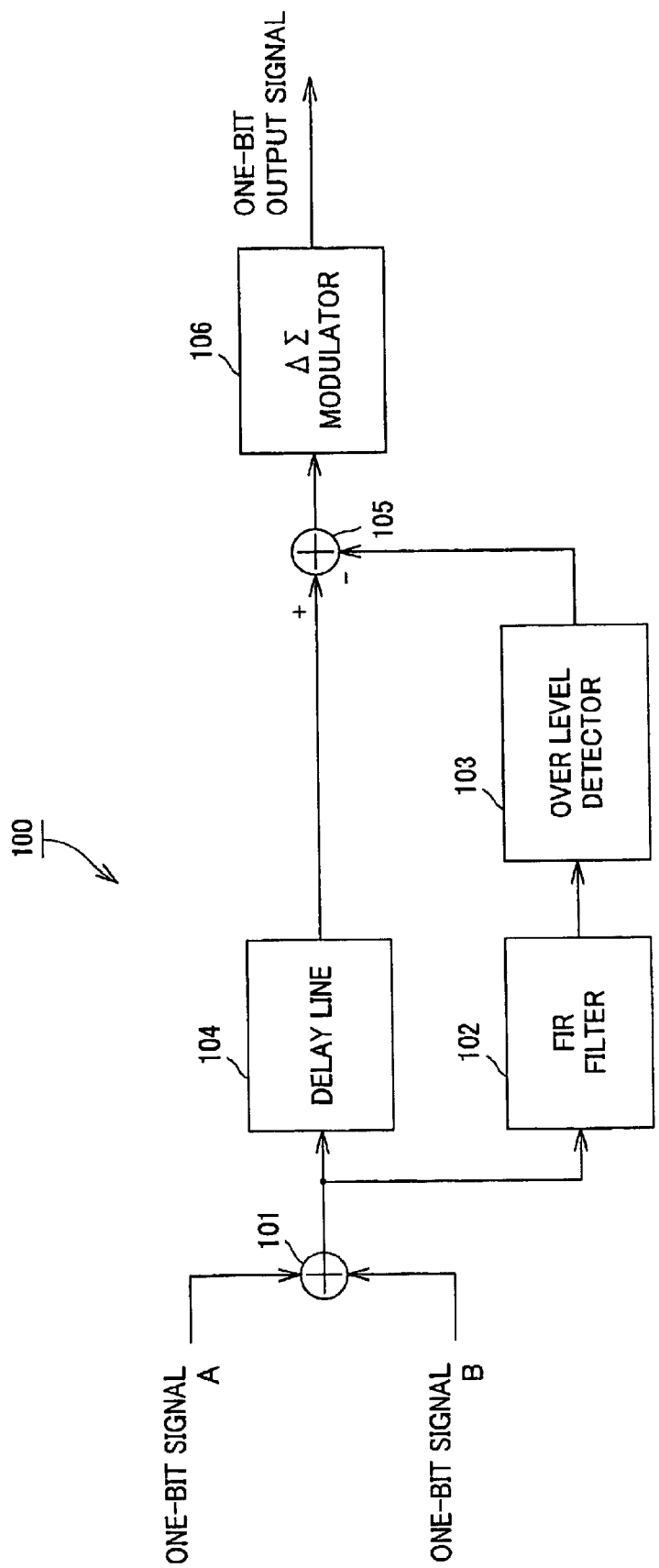
FIG. 10 shows a block diagram of a conventional digital signal processing apparatus.

Next, referring to FIG. 9, the third embodiment of the present invention will be explained. FIG. 9 shows a block diagram of a digital signal processing apparatus 80 of the third embodiment which adds a one-bit signal A and a one-bit signal B, generated through ΔΣ modulation processing, using an adder 2, and sends a resulting added output to a ΔΣ modulator 81 of six order so as to output a one-bit signal. In the digital signal processing apparatus 80, a part of internal configuration of the six-order ΔΣ modulator 81 and a part of internal configuration of a control unit 83 are different from those of the first embodiment. In the digital signal processing apparatus 80 shown in FIG. 9, parts or components similar to those of the digital signal processing apparatus 1 shown in FIG. 1 are indicated with the same reference numerals, and detailed explanation of which will be omitted.

The six-order ΔΣ modulator 81 includes a multiplier 82 instead of the adder 34 used in the first embodiment. The multiplier 82 multiplies a quantized one-bit signal sent from the quantizer 33, to be sent to the respective integrators under feedback processing, by a control signal generated by the control unit 83.

The control unit 83 includes a moving average filter 5, and furthermore, an envelope peak detector 84 and an over level ratio detector 85 both arranged at the downstream of the moving average filter 5. The over level ratio detector 85 detects an over level ratio, and the control unit 83 sends thus detected over level ratio to the multiplier 82 as a control signal. The multiplier 82 multiplies the quantized output sent from the quantizer 33 by the over level ratio.

The envelope peak detector 84 detects the peak level of envelope out of the audio frequency band signal detected by the moving average filter 5 over long time constant. The over level ratio detector 85 calculates a ratio or proportion of the peak level detected by the envelope peak detector 84 to a reference level, when the peak level surpasses the reference level, and sets the ratio to be an over level ratio. For example, when a peak value of ±9.6 is detected in the output of the moving average filter 5 shown in FIG. 4B, the over level ratio of the peak value to the reference level Lref of ±8 is 1.2. The control unit 83 sends thus calculated over level ratio of 1.2 to the multiplier 82. Then, the multiplier 82 multiplies the quantized output sent from the quantizer 33 by the over level ratio of 1.2. Thus, automatic gain control (AGC) can be realized.

As in the above, in the digital signal processing apparatus 80, the moving average filter 5, which brings about delay time equal to that brought about by the second integrator 14 to the quantizer 33 of the ΔΣ modulator 81, detects an audio frequency band signal, and detects an over level ratio surpassing a reference level. Then, after multiplying a quantized output signal by the over level ratio to perform AGC to generate a feedback loop signal, thus generated feedback loop signal is sent to the respective integrators under feedback processing. Thus, limit property for a ΔΣ-modulated signal can be realized using small-sized simple hardware configuration.

In the first to third embodiments, the six-order ΔΣ modulator is used, and signal component of audio frequency band is detected from the second integrator. On the other hand, the present invention is not restricted to above-described configurations, and other configurations may be employed so long as processing time by the moving average filter is equalized with delay time brought about by the ΔΣ modulator.

For example, a five-order ΔΣ modulator may be used to detect signal component of audio frequency band from a second integrator so as to perform limit processing in the same way as the first to third embodiments. In this case, a moving average filter of 8 taps is used.

Moreover, a four-order ΔΣ modulator may be used to detect signal component of audio frequency band from a second integrator. In this case, a moving average filter of 4 taps is used. In case signal component of audio frequency band is detected from a first integrator, a moving average filter of 8 taps is used.

Furthermore, a three-order ΔΣ modulator may be used to detect signal component of audio frequency band from a second integrator. In this case, a moving average filter of 2 taps is used.

Yet furthermore, a seven-order ΔΣ modulator may be used to detect signal component of audio frequency band from a second integrator. In this case, a moving average filter of 32 taps is used. Also, a seven-order ΔΣ modulator may be used to detect signal component of audio frequency band from a third integrator using a moving average filter of 16 taps.

Yet furthermore, an eight-order ΔΣ modulator may be used to detect signal component of audio frequency band from a second integrator. In this case, a moving average filter of 64 taps is used. Also, a seven-order ΔΣ modulator may be used to detect signal component of audio frequency band from a third integrator using a moving average filter of 32 taps. Also, a seven-order ΔΣ modulator may be used to detect signal component of audio frequency band from a fourth integrator using a moving average filter of 16 taps.

In these examples, after signal component of audio frequency band is detected using a moving average filter, a control signal is generated in the same way as the first to third embodiments.

In the first to third embodiments, as an example in which the level of signal component of audio frequency band is enlarged, the case of adding or mixing two one-bit signals is explained. On the other hand, the present invention can be applied to various cases in which the signal level of a processed signal surpasses those of original signals, for example, mixing signals of multiple channels such as three, four, five, six channels, or level controlling of fade-in, fade-out, cross fade.

While the invention has been described in accordance with certain preferred embodiments thereof illustrated in the accompanying drawings and described in the above description in detail, it should be understood by those ordinarily skilled in the art that the invention is not limited to the embodiments, but various modifications, alternative constructions or equivalents can be implemented without departing from the scope and spirit of the present invention as set forth and defined by the appended claims.

Industrial Applicability

According to the apparatus and method for processing a digital signal of the present invention, a filter such as a moving average filter with delay time equal to that brought about by an input side integrator to a quantizer of a $\Delta\Sigma$ modulator detects an audio frequency band signal, and a control signal is generated based on a over level surpassing a reference level, and the control signal is added to a quantized output signal or a quantized output signal is multiplied by the control signal to generate a feedback loop signal. Then, thus generated feedback loop signal is sent to the respective integrators under feedback processing. Thus, limit processing for a $\Delta\Sigma$-modulated signal can be realized under simple configuration.

What is claimed is:

1. An apparatus for processing a digital signal having a plurality of integrators connected in series that perform modulation for a one-bit input signal, comprising:

quantization means for quantizing an output sent from the last integrator of the plurality of integrators connected in series to generate a one-bit signal;

control means for generating a control signal that controls an amplitude level of a signal component of an audio frequency band of a one-bit signal sent from the quantization means, the one-bit signal being sent to the plurality of integrators under feedback processing; and amplitude change means for changing an amplitude level of a signal component of an audio frequency band of a one-bit signal sent from the quantization means based on the control signal sent from the control means, wherein the control means generates the control signal based on an output sent from one integrator of the plurality of integrators connected in series.

2. The apparatus for processing a digital signal as set forth in claim 1, wherein the control means comprises filter means for extracting the signal component of the audio frequency band out of an output sent from one integrator of the plurality of integrators connected in series.

3. The apparatus for processing a digital signal as set forth in claim 2, wherein the filter means generates a time delay to adjust a time delay brought about by the plurality of integrators.

4. The apparatus for processing a digital signal as set forth in claim 1, wherein the control means comprises means for comparing an output sent from the one integrator of the plurality of integrators connected in series with a predetermined reference signal and generates the control signal based on a result of the comparison.

5. The apparatus for processing a digital signal as set forth in claim 4, wherein the control means further comprises level change means for multiplying the result of the comparison between the output sent from the one integrator of the plurality of integrators connected in series and the predetermined reference signal a predetermined number of times.

6. The apparatus for processing a digital signal as set forth in claim 5, wherein the control means further has limiter property change means for giving a non-linear property to the result of the comparison between the output sent from the one integrator of the plurality of integrators connected in series and the predetermined reference signal.

7. The apparatus for processing a digital signal as set forth in claim 1, wherein the control means comprises:

envelope peak detection means for detecting a peak of an envelope of an output sent from the one integrator of the plurality of integrators connected in series over a long time constant, and over level ratio detection means for calculating a ratio of a peak value detected by the envelope peak detection means to a reference level when the peak value surpasses the reference level, and the control means generates the control signal based on the calculated ratio.

8. The apparatus for processing a digital signal as set forth in claim 1, wherein the amplitude change means adds the control signal sent from the control means to a one-bit signal sent from the quantization means to change the amplitude level of the one-bit signal sent from the quantization means.

9. The apparatus for processing a digital signal as set forth in claim 1, wherein the amplitude change means multiplies a one-bit signal sent from the quantization means by the control signal sent from the control means to change the amplitude level of the one-bit signal sent from the quantization means.

10. A method for processing a digital signal using a plurality of integrators connected in series that performs modulation for a one-bit input signal, comprising:

a quantization step of quantizing an output sent from the last integrator of the plurality of integrators connected in series to generate a one-bit signal;

a control step of generating a control signal that controls an amplitude level of a signal component of an audio frequency band of the one-bit signal that is generated by the quantization step, the one-bit signal being sent to the plurality of integrators under feedback processing; and an amplitude change step of the changing the amplitude level of signal component of the audio frequency band of the one-bit signal that is generated by the quantization step based on the control signal, wherein the control signal is generated based on an output sent from one integrator of the plurality of integrators connected in series.

11. The method for processing a digital signal as set forth in claim 10, wherein in generating the control signal, the signal component of the audio frequency band is extracted out of an output sent from the one integrator of the plurality of integrators connected in series using a filter.

12. The method for processing a digital signal as set forth in claim 10, wherein the control signal is generated based on a comparison result obtained by comparing an output sent from the one integrator of the plurality of integrators connected in series with a predetermined reference signal.

13. The method for processing a digital signal as set forth in claim 12, wherein in generating the control signal, a level change is further performed in which the comparison result between the output sent from the one integrator of the plurality of integrators connected in series and the predetermined reference signal is multiplied a predetermined number of times.

14. The method for processing a digital signal as set forth in claim 13, wherein in generating the control signal, limiter property change is further performed in which a non-linear property is given to the comparison result between the output sent from the one integrator of the plurality of integrators connected in series and the predetermined reference signal.

15. The method for processing a digital signal as set forth in claim 11, wherein in generating the control signal, a peak value of an envelope is detected from the output sent from the one integrator of the plurality of integrators connected in series over a long time constant, and a ratio of the detected peak value to a reference level, when the peak value surpasses the reference level, is calculated, and the control signal is generated based on the calculated ratio.

16. The method for processing a digital signal as set forth in claim 10, wherein in changing the amplitude level, the control signal is added to the one-bit signal that is generated by quantizing an output of the last integrator to change the amplitude level of the one-bit signal that is generated by quantizing the output of the last integrator.

* * * * *